United States Patent
Gudesen et al.

(10) Patent No.: US 6,762,950 B2
(45) Date of Patent: Jul. 13, 2004

(54) FOLDED MEMORY LAYERS

(75) Inventors: Hans Gude Gudesen, Brussels (BE); Per-Erik Nordal, Asker (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/306,229

(22) Filed: Nov. 29, 2002

(65) Prior Publication Data

US 2003/0128601 A1 Jul. 10, 2003

Related U.S. Application Data

(60) Provisional application No. 60/334,127, filed on Nov. 30, 2001.

(30) Foreign Application Priority Data

Nov. 30, 2001 (NO) .......................... 2001 5871

(51) Int. Cl.[7] .............................. G11C 11/22
(52) U.S. Cl. ................... 365/145; 365/51; 365/130; 365/129
(58) Field of Search ................... 365/145, 51, 130, 365/129

(56) References Cited

U.S. PATENT DOCUMENTS 5,973,953 A    10/1999  Yamashita et al.
6,424,553 B2 *  7/2002  Berggren et al. ............. 365/51
6,483,736 B2 * 11/2002  Johnson et al. ............. 365/130
6,498,744 B2   12/2002  Leistad et al.

FOREIGN PATENT DOCUMENTS

NO      309500 B1      2/2001
WO    WO 99/12170 A2   3/1999
WO    WO 99/63527 A2  12/1999
WO    WO 03/046924 A1  6/2003

* cited by examiner

*Primary Examiner*—Richard Elms
*Assistant Examiner*—Toan Le
(74) *Attorney, Agent, or Firm*—Birch, Stewart, Kolasch & Birch, LLP

(57) ABSTRACT

A ferroelectric or electret volumetric memory device with a memory material provided in sandwich between first and second electrode layers with stripe-like electrodes forming word lines and bit lines of a matrix-addressable memory array, memory cells are defined in volumes of memeory material in between two crossing word lines and bit lines and a plurality of memory arrays are provided in a stacked arrangement. A stack of memory arrays is formed by tow or more ribbon-like structures, which are folded and/or braided into each other. Each ribbon-like structure includes a flexible substrate of non-conducting material and the electrode layers respectively provided on each surface of the substrate and including the parallel strip-like electrodes extending along the ribbon-like structure. A layer of memory material covers one of the electrode layers whereby each memory array of the stack is formed by overlapping portions of a pair of adjacent ribbon-like structures and crossing in substantially orthogonal relationship.

12 Claims, 5 Drawing Sheets

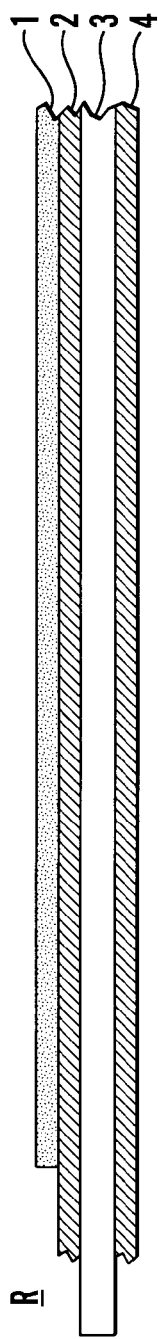
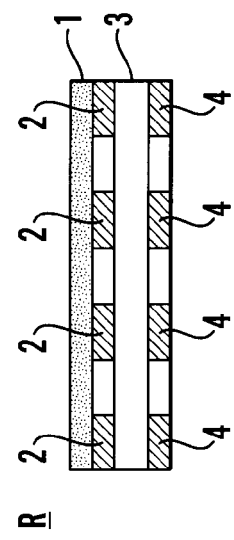
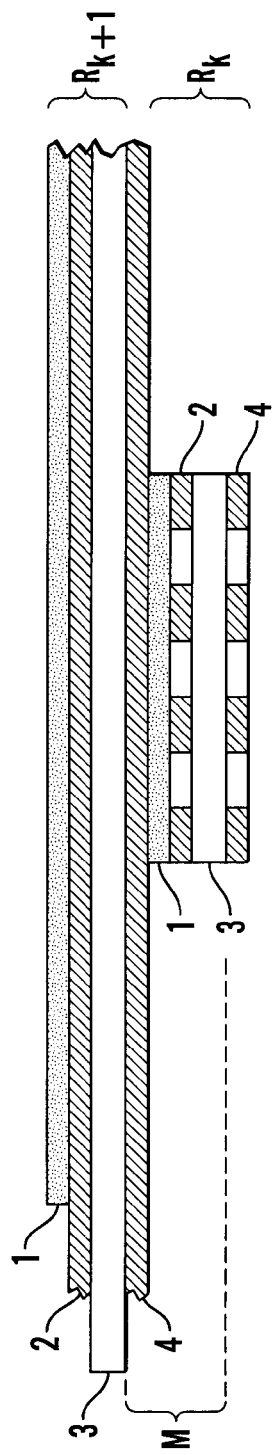
Fig. 1a
Fig. 1b
Fig. 1c

FOLDED MEMORY LAYERS

This application claims priority on provisional Application No. 60/334,127 filed on Nov. 30, 2001, the entire contents of which are hereby incorporated by reference.

The present invention concerns a ferroelectric or electret volumetric memory device, wherein a ferroelectric or electret memory material is provided in sandwich between first and second electrode layers respectively comprising first and second parallel stripe-like electrodes forming word lines and bit lines of a matrix-addressable memory array, wherein word lines and bit lines of the array are oriented substantially at right angles to each other, wherein memory cells are defined in volumes of memory material sandwiched between respective crossings word lines and bit lines, and wherein a plurality of memory arrays are provided in at least one stack such that the at least one stack of memory arrays realizes the memory device with a volumetric configuration.

In a wider sense the present invention also concerns data storage and/or processing devices based on ferroelectric thin films.

No prior art of direct relevance regarding braiding/folding as taught in the present invention has been identified. However, a brief general background shall be given to illustrate the present state of the art, put the present invention into context and highlight the objects of the invention:

Memory chips have the advantage over conventional magnetic, optical and other mechanical storage devices of being capable of very fast read and write operations. Furthermore, they are solid state, have reasonably low power consumption and may offer high transfer speeds. The disadvantage is their limited capacity to store information, and a relatively high production cost relative to the storage capacity. Due to scaling problems and limited area, typically restricted to less than 1 $cm^2$/chip, this situation is not likely to be much altered in the foreseeable future.

A solid state memory concept which circumvents the limitations described above has been developed based on hybrid silicon/polymer chips. The approach includes stacking thin layers of polymeric memory films on silicon substrates and accessing the passively addressed memory layers via the substrate circuitry. The problem with this solution, however, is that the number of memory layers in the stack typically is limited to 8–16 layers. Increasing this number is technically possible, but generally not practically viable for most mass market applications. Negative factors in this connection include extra overhead and real estate costs for driver circuitry (decoders and sense amplifiers in particular); reduced yield due to increased number of processing steps; problems associated with planarization when the number of memory layers becomes larger then the range mentioned; and a larger number of processing steps increasing the risk that underlying polymer layers are negatively affected, with a reduced functionality as a result.

There is also an unbalance in the hybrid memory concept to the extent that producing the silicon part is complex and requires advanced (albeit standard) fabrication processing, while building the memory stack in itself is a very simple low cost procedure, which potentially could be done outside fabrication facility, with non-lithographic tools. However, when these stacks are built on silicon the factors listed above combine to make this more costly and capacity limiting than desirable, e.g. it does become more cost effective to use two or several chips to achieve the same capacity.

Also, the procedure used to deposit memory films on silicon is in practice limited to simple spin coating. This deposition technique has several advantages, but may also introduce unwanted side effects, like creating a larger than desirable internal stress, problems in controlling the film morphology and uniformity, etc. One procedure used to improve morphology is stretching of films, which cannot be applied in the hybrid case, another is to anneal films under high pressure which is not very applicable either (when spin coating and rigid substrates like silicon is used).

Because of the area restrictions related to a silicon-based device, the only feasible patterning approach is standard photomicrolithography i.e. providing ahigh resolution line pitch. This excludes low cost, non-lithographic patterning tools like inkjet printing and micropatterning.

Another problem related to the hybrid concept is packaging, especially soldering, which requires temperatures much higher than the melting temperature of polymers (more than 60° C. higher). The polymer does not necessarily destruct when exposed to higher temperatures than its melting temperature, but a rework (reanneal) is required to bring back the film properties. More problematic is what happens to the electrode/film interface, which easily is destroyed when the polymer enters the liquid phase. This represents is substantial problem when multilayer stacks are involved.

Film properties are also seriously affected by electrode application, e.g. the top electrode deposition may have negative effects on the bottom electrode interface, e.g. by kicking off undesired ion transport, which may initiate a fatigue process in the polymer films. Morphological chain defects may also be induced.

In regard of the above-mentioned disadvantages, it is thus a first object of the present invention to provide novel architectures for solid state thin-film-based devices whereby the effective area available for data storage and/or processing can be made large through stacking of individual layers in a dense volumetric structure.

It is a second object of the present invention to prescribe how such stacking can be achieved in a practical manner while at the same time providing individual addressability for locations inside the stack through a limited number of electrical connections that are accessible from the outside of the stack.

It is a third object of the present invention to provide stacks containing a multiplicity of matrices, where each matrix contains a large number of thin-film cells that can be individually connected via passive matrix addressing.

It is a fourth object of the present invention to provide individual stacks in the form of modular units suitable for integration into devices with specialized functions and/or into larger units that add the capacities of two or more separate stacked units.

It is a fifth object of the present invention to apply the stacking concept to the manufacturing of data storage and/or processing devices that contain sub-units demanding mutually incompatible process steps.

The above objects as well as further features and advantages are realized with a memory device which according to the invention is characterized in that a stack of memory arrays is formed with two or more ribbon-like structures being folded and/or braided into each other, each ribbon-like structure comprising a flexible substrate of non-conducting material, that first and second electrode layers respectively, provided on each surface of the substrate, such that the electrode layers each comprises the parallel stripe-like electrodes provided extending along the ribbon-like structure and a layer of memory material covers one of the electrode layers thereof and extends uninterrupted between the edges of the ribbon-like structure, that each memory array of the stack is formed by overlapping portions of a pair of adjacent ribbon-like structures folded and/or braided such that they cross in substantially orthogonal relationship, and that the word lines and the memory layer of a memory array in a stack are contained in the first ribbon-like structure of a pair of adjacent structures of this kind and the bit lines contained in the second ribbon-like thereof.

Further features and advantages of the present invention are disclosed by the dependent claims.

BRIEF DESCRIPTION OF THE DRAWINGS

The invention shall now be explained in greater detail with reference to preferred embodiments and the appended drawing figures, of which FIG. 1a shows a longitudinal cross-section of ribbon-like structure as used in the present invention, FIG. 1b a transversal cross-section thereof, FIG. 1c two ribbon-like structures crossing and contacting each other, forming a memory array in the overlap area, FIG. 2a an example of a stack of ribbon-like structures according to the invention, FIG. 2b an example of an embodiment of the present invention with two stacks similar to the one in FIG. 2a, FIGS. 3a, 3b cross sections of respectively the first and second stacks in FIG. 2b, FIG. 4a schematically a ribbon-like structure with connection areas or contact fields on the front and back, and FIG. 4b how the ribbon-like structures may be provided to form stacked memory arrays according to another embodiment of the present invention.

Figure 2A:
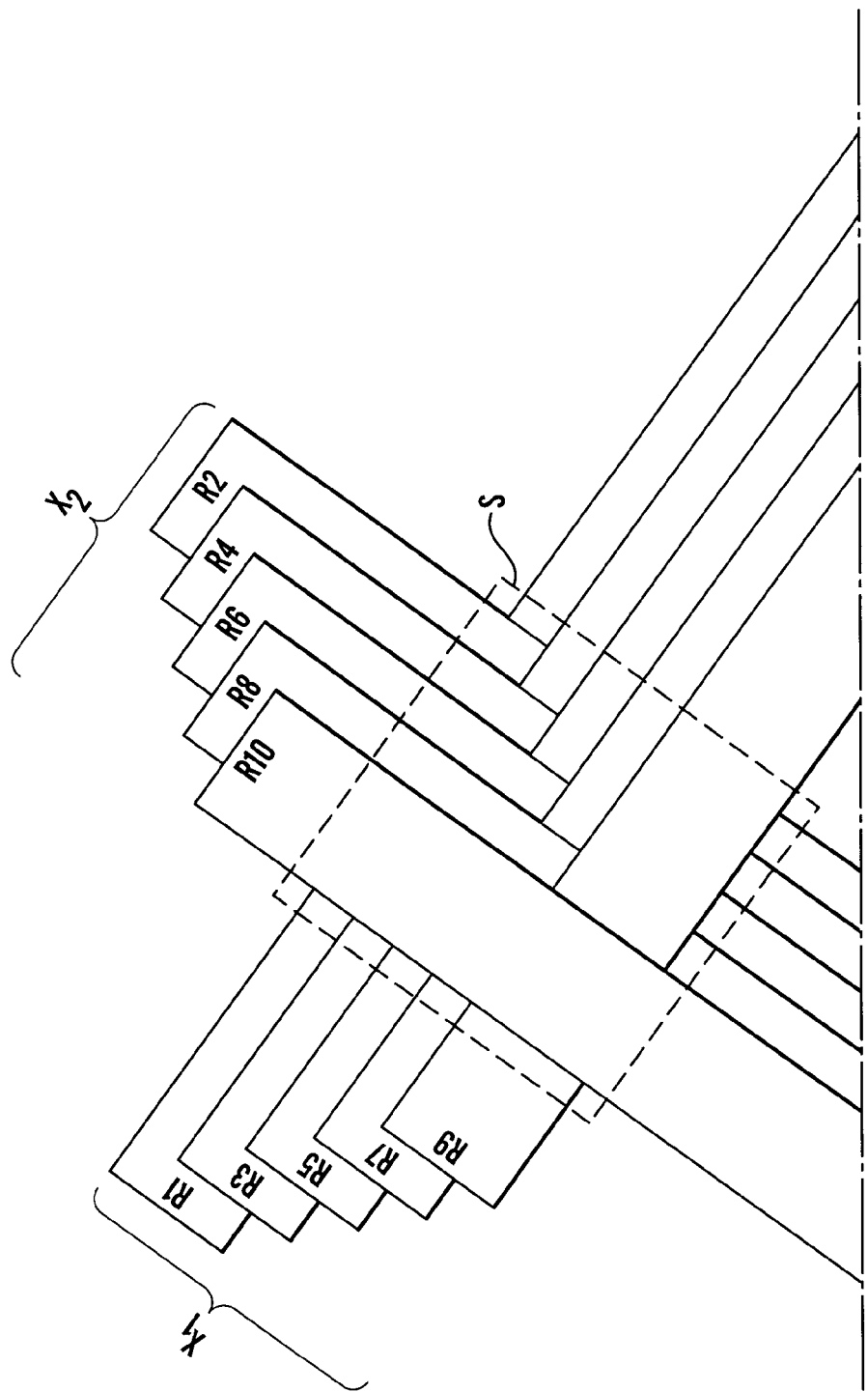

According to the invention, shown in FIGS. 1a and 1b, there is provided a ribbon with a carrier substrate 3 of a flexible material (e.g. polymer or metal) coated on one surface with a thin layer of memory film 1 on top of parallel electrodes 2 (in the longitudal direction), while the opposite surface of the ribbon either has a similar structure or a layer of parallel electrodes 4 only, the whole embodiment thus constituting a ribbon-like structure R (henceforth termed only as "ribbon") as used in the present invention.

The memory film 41 has addressing, charge storing (bistability) and/or switchability capabilities allowing memory matrices to be passively addressed and memory cells to be constituted by the memory film 1 being sandwiched between crossing electrodes 2;4 by a suitable arrangement of two or more ribbons contacting each other and oriented mutually at an angle of about 90°.

According to a preferred embodiment of the invention two or more ribbons R are stacked together, such that at each interface portion a memory matrix M is created in the adjoining ribbons and, represented by top and bottom electrodes 2;4 and the memory film 1 in between. This is illustrated in FIG. 1c, showing a crossing between two ribbons $R_k$ and $R_{k+1}$ which may constitute part of a larger stack. The ribbons R may have an arbitrary width and are mutually oriented in 90° angles with respect to each other such that the resulting stack has a square/cubic (chip like) shape. FIG. 2a shows how ribbon R2 is stacked against ribbon R1, ribbon R3 against ribbon R2, and so forth, up to ribbon R10 stacked against ribbon R9.

In FIG. 2a the odd-numbered ribbons R1, . . . R9 form a first subset or assembly $X_1$, the even-numbered ribbons R2, . . . R10 a second assembly $X_2$ oriented perpendicularly to the first. The resulting memory arrays form a stack S.

The ribbon overlaps are laminated together through an anneal process, e.g. under high vacuum/high pressure. By using a similar structure, i.e. memory film against memory film, compatibility problems related to the lamination process may be substantially reduced.

Figure 2B:
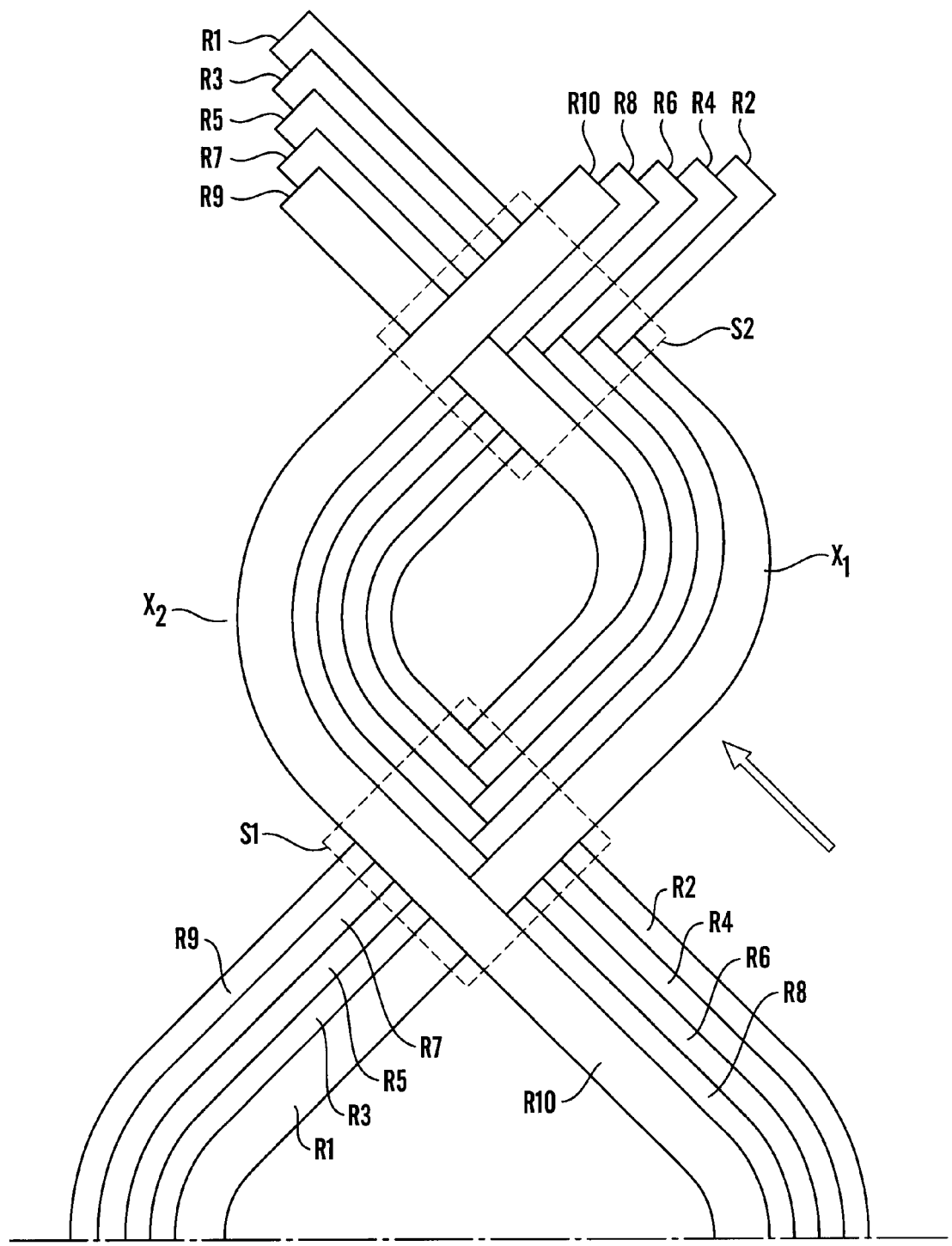

In an alternative embodiment the ribbons are folded according to a plurality of patterns, including concertina-wise, oval, circular/ring or twisted, as e.g. shown in FIG. 2b. "Woven" threads may be made, which again can be used to make fabrics, etc. It will be possible to build large area structures in this way, thus enabling integration of memory into other devices, like into the casing of mobile phones, as a "top coating" on curved or other surfaces, etc.

The ribbons R1, . . . R9 arranged in a first subset or assembly $X_1$ and the ribbons R2, . . . R10 arranged in a second subset or assembly $X_2$ are applied in a memory device according to the invention. The embodiment of such a memory device as shown in FIG. 2b forms two distinct stacked structures S1, S2 as indicated by the boxes with stitched outlines. Each of the ribbons R1–R10 is bent such that pairs of odd and even numbered ribbons are permuted in the stack S2 with respect to the succession of ribbons in stack S1. This implies e.g. that the lowermost ribbon R9 in stack S1 is bent upwards to pair with the ribbon R10, while e.g. ribbon R1 which is paired with ribbon R10 in the stack S1 now is bent downwards to pair with ribbon R2 in stack S2.

If the embodiment shown in FIG. 2b is regarded as a plan view of the arrangement of the ribbons in the device according to the invention, it will by persons skilled in the art readily be understood that the combination of displacements and staggering shall provide a significant contribution with regard to minimizing capacitive crosstalk or other undesired couplings between the separate memory arrays M forming each stack. Not only can each individual memory cell in a memory array in a stack be addressed, i.e. written or read, without unwanted disturbances which seriously reduce the signal/noise ratio of e.g. an output signal, but in addition a parallel addressing of all memory cells in an array and if desired all memory arrays in a stack will be possible while simultaneously still keeping any disturbing influences at a minimum.

Figures 3A, 3B:
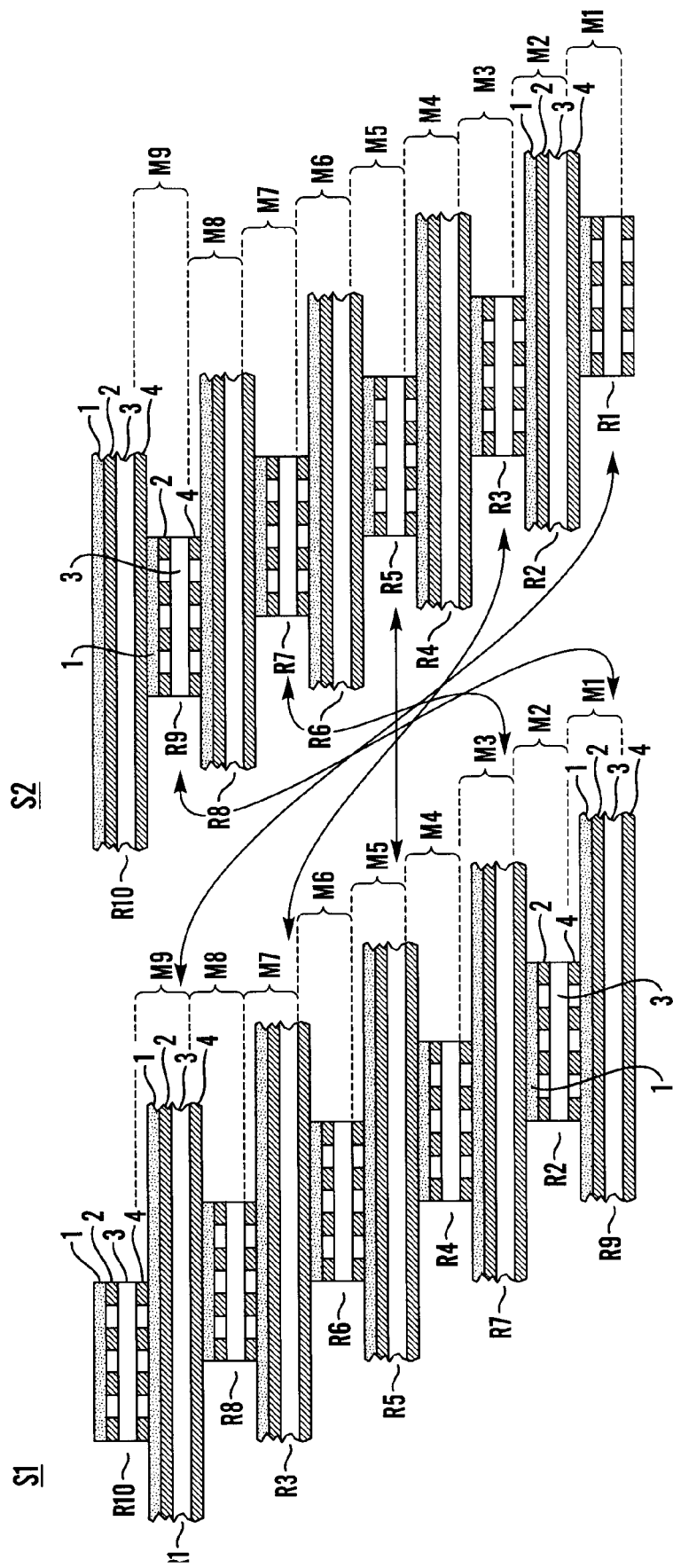

The arrangement of the stacks S1, S2 in the memory device according to the invention is shown to better advantage in cross sections in respectively FIGS. 3a, and 3b. In stack S1 (FIG. 3a) the first ribbon R9 is provided orthogonally to the second ribbon R2 and second electrodes 2 in ribbon R9 now can be considered as word lines in a memory array M1 with the bit lines provided by the electrodes 4 in ribbon R2 and so on. In other words a memory array M comprises and is formed by a portion of respectively adjacent pairs of ribbons $R_k$, $R_{k+1}$ in a stack S. The stack S2 as shown in FIG. 3b appears similar to the stack S1 in FIG. 3a, but with the directions of adjacent pairs of ribbons R now rotated by 90° such that the orthogonal crossing between successive ribbons in the stack S2 is retained. It will be seen from FIG. 2b that the first assembly $X_1$ of odd-numbered ribbons R1 . . . R9 and the second assembly $X_2$ of even-numbered ribbons R2 . . . R10 each could be followed by a similar adjacent assembly of ribbons provided in the lateral direction (i.e. in a side-by-side arrangement) with a corresponding orientation such that additional stacked structures S could be formed in the regions where the assemblies $X_1$, $X_2$ intersect. The additional assemblies of ribbons can also be provided in a staggered arrangement if so desired. Moreover it can also be seen from a contemplation of the arrangement in FIG. 2b that the direction of staggering could inverted between neighbour stacks of memory arrays, i.e. for instance of ribbon R9 in stack S1 would still pair with ribbon R10 in stack S2, but now in the projected position of ribbon R1 in stack S2, while of course ribbon R1 then still would pair with ribbon R2 in stack S2, but now in the projected position as shown for ribbon 9 in FIG. 2b, and so on. The implication of this is of course that similar considerations would also be applied to the stagger of the ribbons in the even-numbered assembly $X_2$ of ribbons R2, . . . R10. The distance as measured by the length of the electrodes 2,4 and ribbons R between the memory arrays M in one stack S1 and the memory arrays M in the other stack S2 would then be similar.

Figure 4A:
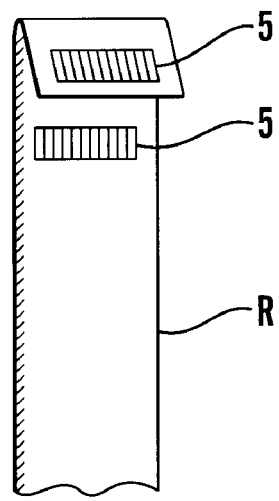
Figure 4B:
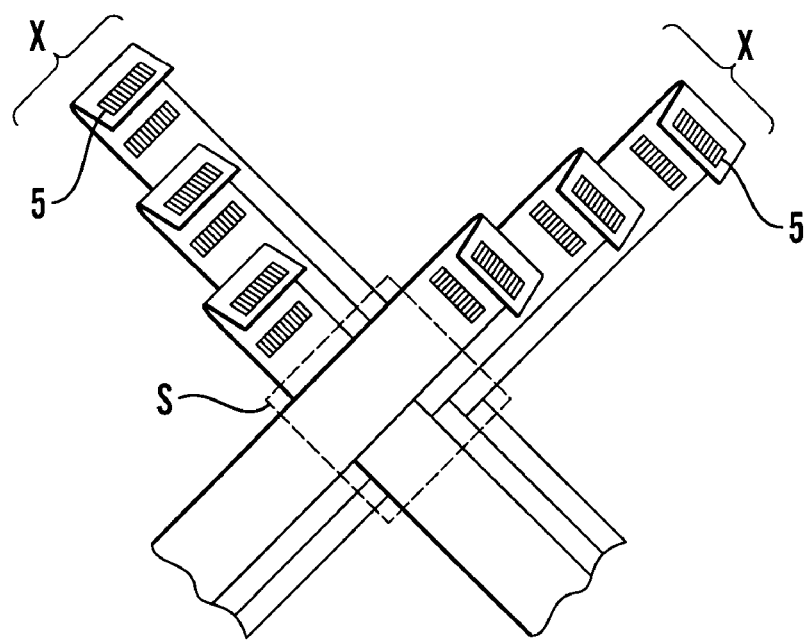

At the end of the ribbons R there can be provided connecting and contact means, as shown in FIGS. 4a and 4b. This would e.g. allow the electrodes 2,4 to be passively connected to pads on an underlying, not shown silicon chip, in which case sufficient redundancy is required to allow for a certain degree of misalignement. Alternatively or in addition there is provided for some (e.g. decoder/router) circuitry based on thin-film transistors (TFT) at the electrode ends, reducing the number of contacting points to facilitate a more robust connection. Such robustification may not only allow for a much denser electrode pattern, and thus increased storage density, but also allow folded (and packaged) memory stacks to be connected to the silicon chips (or pads connected to the silicon chip(s) by the end user, thus opening up for very low cost add-on memory modules.

A further enhancement of this concept would be to provide all driver circuitry, also including sensing circuitry, and required to operate the memory at the ribbon ends. This would turn into the folded memory stack completely self-sustained unit.

Yet another enhancement would be to distribute the required circuitry evenly over the ribbons, directly in contact with (at the sides of) each individual memory matrix, as row and column drivers/decoders, and just contacting every one of these to a common bus/traffic coordinator on the ribbon(s) and then communicate with external hardware via hardwired or wireless contact(s).

When silicon or silicon/TFT circuitry on a supporting substrate is used, ribbon surfaces can be attached to silicon driver circuitry by bending one surface end over the other as shown in FIG. 4b before attachment to contact pads on the underlying, not shown device substrate surface. If all driver circuitry is built on the ribbon(s) such bending is not required.

The resulting memory stack M built in this manner represents novel approaches and solutions to the problems discussed in the introduction. What basically takes place from an architectural standpoint is that because each memory array M is built on an individual substrate, the challenges are mostly reduced to those related to building single layer memories. This shall involve simple modular sub-units represented by the individual ribbons, which can be manufactured in specialized manufacturing equipment before being assembled in scalable fashion into stacks.

The concept allows the use of a very large number of stackable memory ribbons, the only restriction being access to silicon real estate in the silicon or hybrid silicon/TFT circuitry case, a restriction which does not exists in the "all circuitry on the ribbon (all-TFT)" case. This translates directly into a very large storage capacity, or arbitrarily large storage capacity in the all-TFT cases.

Because the approach is close to processing a single layer memory, most, if not all, the process and temperature compatibility issues related to multi-layer processing vanish.

Similarly, by avoiding the deposition of top electrodes directly onto the memory films, possible negative effects of such procedure can also be avoided. A further positive effect on film morphology is the possibility to utilize stretching of the films before baking, thus ensuring a more orderly crystalline structure. Alternative deposition techniques to spin coating, like dip-coating/doctor blading/meniscus coating, may also have positive influence on film morphology.

Because the available area is large, a much more relaxed patterning process can be implemented, allowing non-lithographic tools and true reel-to-reel processing to be realised. This in its turn appreciably shall reduce the production costs.

The large feature sizes that can be utilized will also improve the signal/noise ratios with respect to cell signals, simply because cell sizes are so much larger. This will allow more variation in film thickness etc., thus reducing potential problems related to processing memory structures on flexible substrates.

High temperature packaging is facilitated in cases where devices are built on silicon chips, since the silicon part can be processed and soldered before the polymer is attached.

What is claimed is:

1. A ferroelectric or electret volumetric memory device, wherein a ferroelectric or electret memory material is provided in sandwich between first and second electrode layers respectively comprising first and second parallel stripe-like electrodes forming word lines and bit lines of a matrix-addressable memory array, wherein word lines and bit lines of the matrix-addressable memory array are oriented substantially at right angles to each other, wherein memory cells are defined in volumes of memory material sandwiched between respective crossing word lines and bit lines, and wherein a plurality of memory arrays are provided in at least one stack such that the at least one stack of memory arrays realizes the memory device with a volumetric configuration, wherein a stack of memory arrays is formed with two or more ribbon-like structures being folded and/or braided into each other, each ribbon-like structure comprising a flexible substrate of non-conducting material, where first and second electrode layers respectively, are provided on each surface of the substrate, such that the first and second electrode layers each comprise parallel stripe-like electrodes provided extending along the ribbon-like structure, and a layer of memory material covers one of the electrode layers thereof and extends uninterrupted between the edges of the ribbon-like structure, that each memory array of the stack is formed by overlapping portions of a pair of adjacent ribbon-like structures folded and/or braided such that they cross in substantially orthogonal relationship, and that the word lines and memory layer of the memory array in the stack are contained in the first ribbon-like structure of a pair of adjacent structures of this kind and the bit lines contained in the second ribbon-like structure thereof.

2. A ferroelectric or electret volumetric memory device according to claim 1, wherein every second memory array of the stack is provided in a mutually staggered arrangement.

3. A ferroelectric or electret volumetric memory device according to claim 1 wherein more than one stack is provided, wherein the ribbon-like structures are folded and/or braided in a manner so as to realize a pair-wise permutation of the succession of ribbon-like structures from stack to stack.

4. A ferroelectric or electret volumetric memory device according to claim 1, wherein the ribbon-like structures are arranged in two or more sub-sets thereof, with the ribbon-like structures in each given sub-set being oriented parallel to each other as viewed from the top of the stacks, and non-parallel to ribbon-like structures in other, different subsets.

5. A ferroelectric or electret volumetric memory device according to claim 4, wherein at least one ribbon-like structure from each of at least two subsets is provided with longitudinal electrodes on one side and a global memory layer on the other.

6. A ferroelectric or electret volumetric memory device according to claim 4, wherein the numbers of the ribbon-like structures and subsets thereof are selected to minimize the length of the ribbon-like structures compatible with a given functionality of the stack.

7. A ferroelectric or electret volumetric memory device according to claim 1, wherein each of the ribbon-like structures has been pre-formed and prepared with insulating and/or conducting and/or semiconducting layers and structures in its cross section and/or on one or both of its surfaces.

8. A ferroelectric or electret volumetric memory device according to claim 1, wherein two or more ribbon-like structures in the stack have a set of electrodes on one or both sides of the ribbon-like structures and extending the length of the ribbon-like structures.

9. A ferroelectric or electret volumetric memory device according to claim 8, wherein each electrode is electrically accessed by being connected to a contacting field or area incorporating active and/or passive circuitry at or near one or both ends of the ribbon-like structures, said contacting field in turn being connected electrically or optically to circuitry external to ribbon-like structures.

10. A ferroelectric or electret volumetric memory device according to claim 1, wherein the stack contains at least two different types of ribbon-like structures.

11. A ferroelectric or electret volumetric memory device according to claim 1, wherein at least one ribbon-like structure in the stack has a global insulating layers one or both of its surfaces.

12. A ferroelectric or electret volumetric memory device according to claim 1, wherein at least one ribbon-like structure in the stack has a length which is different from the other ribbon-like structure, in the stack.

* * * * *